United States Patent
Meng et al.

(10) Patent No.: US 8,753,930 B2
(45) Date of Patent: Jun. 17, 2014

(54) METHOD OF MANUFACTURING SEMICONDUCTOR DEVICE INCLUDING ASHING OF PHOTORESIST WITH DEUTERIUM OR TRITIUM GAS

(75) Inventors: Xiaoying Meng, Shanghai (CN); Junqing Zhou, Shanghai (CN); Haiyang Zhang, Shanghai (CN)

(73) Assignee: Semiconductor Manufacturing (Shanghai) Corporation (CN)

(*) Notice: Subject to any disclaimer, the term of this patent is extended or adjusted under 35 U.S.C. 154(b) by 0 days.

(21) Appl. No.: 13/326,275

(22) Filed: Dec. 14, 2011

(65) Prior Publication Data

US 2012/0289017 A1  Nov. 15, 2012

(30) Foreign Application Priority Data

May 9, 2011  (CN) .......................... 201110117450.5

(51) Int. Cl.
  *H01L 21/302*  (2006.01)
  *H01L 21/336*  (2006.01)
  *H01L 21/461*  (2006.01)

(52) U.S. Cl.
  USPC ........... 438/199; 438/231; 438/303; 438/305; 438/689; 438/714; 438/725; 257/E21.256; 257/E21.492; 257/E21.634

(58) Field of Classification Search
  USPC ......... 438/199, 231, 303, 305, 689, 714, 725; 257/E21.256, E21.492, E21.634
  See application file for complete search history.

(56) References Cited

U.S. PATENT DOCUMENTS

| | | | | |
|---|---|---|---|---|
| 6,030,901 | A * | 2/2000 | Hopper et al. | 438/711 |
| 7,001,848 | B1 * | 2/2006 | Smith et al. | 438/725 |
| 2004/0102047 | A1 * | 5/2004 | Hayami et al. | 438/690 |
| 2005/0124129 | A1 * | 6/2005 | Ito | 438/308 |
| 2006/0281312 | A1 * | 12/2006 | Smith et al. | 438/689 |
| 2011/0297534 | A1 * | 12/2011 | Holland et al. | 204/290.01 |

* cited by examiner

*Primary Examiner* — Charles Garber
*Assistant Examiner* — Ron Pompey
(74) *Attorney, Agent, or Firm* — Innovation Counsel LLP

(57) ABSTRACT

A method of manufacturing a semiconductor device comprises placing a semiconductor substrate in an ashing chamber, the semiconductor substrate having a gate, a silicon nitride gate sidewall offset spacer or a silicon nitride gate sidewall pacer formed thereon, and a photo resist residue remaining on the semiconductor substrate, introducing a gas mixture including $D_2$ or $T_2$ into the ashing chamber, and ashing the photo resist residue using a plasma that is formed from the gas mixture. The gas mixture can include a deuterium gas or a tritium gas having a volume ratio ranging between about 1% and about 20%. Embodiments can reduce Si recess and the loss of silicon nitride thin film during ashing.

9 Claims, 6 Drawing Sheets

METHOD OF MANUFACTURING SEMICONDUCTOR DEVICE INCLUDING ASHING OF PHOTORESIST WITH DEUTERIUM OR TRITIUM GAS

CROSS-REFERENCES TO RELATED APPLICATIONS

This application claims priority to Chinese Patent Application No. 201110117450.5, filed on May 9, 2011 and entitled "METHOD OF MANUFACTURING SEMICONDUCTOR DEVICE", which is incorporated herein by reference in its entirety.

BACKGROUND OF THE INVENTION

1. Field of the Invention

The present invention relates to semiconductor processing technology, and more particularly, to a method of removing photo resist residues in the manufacturing of semiconductor devices.

2. Description of the Related Art

Photo resist, also called resist for short, is a macromolecular compound whose erosion resistance capacity will be changed after lighting. Photo resist is a photosensitive material. In some semiconductor manufacturing processes, a photo resist layer can be formed on a surface of a device (such as a semiconductor wafer), and a patterned photo resist can be formed after lithography. As such, the surface which is not covered by the photo resist is exposed, and the surface that is covered by the photo resist is protected by the photo resist. Some semiconductor processes, such as etching, deposition and ion implantation can be performed on the exposed surface and the remaining photo resist. After one or more semiconductor processes, the remaining photo resist can be removed with a stripping process. Ashing is, for example, a commonly used process for removing a photo resist.

As the feature sizes of semiconductor devices continue to shrink to 65 nm and beyond, an LDD (Lightly Doped Drain) ashing process gains more attention on film loss control, in addition to the photo resist removal capability. For example, in the LDD ashing process, the loss of the thin film includes the loss of Si, SiGe, and silicon nitride offset spacer, silicon nitride spacer thin film, and the like.

Conventional ashing processes use oxygen ($O_2$), plasma. The main problems include Si recess and a film property change, which may lead to issues of LDD litho patterning scrumming, and have difficulty to meet current process requirements.

Thus, a process which uses a gas mixture including hydrogen ($H_2$) and $O_2$ to generate plasma for the ashing process has been developed. Although the process reduces the loss of Si, it cannot eliminate negative effects such as the loss of the silicon nitride offset spacer and the like. Currently, the ratio of $H_2$ in the gas mixture is about 4%, and the ratio of nitrogen ($N_2$) in the gas mixture is about 96%. In the finer process compared with the 45 nm process, higher ratio of $H_2$, such as 10% is required in order to minimize or reduce the loss of Si. Then, the loss of silicon nitride spacer will become more serious.

FIG. 1 shows a diagram of the comparison between the effect of an ashing process using $O_2$ and the effect of an ashing process using a $H_2/N_2$ gas mixture. The diagram labeled "a" on the left illustrates an effect of the ashing process using $O_2$. The diagram labeled "b" on the right illustrates an effect of the ashing process using a $H_2/N_2$ gas mixture. In the photo resist stripping process after an LDD implantation, the $O_2$ rich ashing does not generate residues, however, the result of Si recess is far from satisfactory. The total Si recess in an LDD region is larger than 15 Å. The $H_2/N_2$ gas mixture rich ashing does not generate residues either, and generates less Si recess (8 Å less than the $O_2$ rich ashing). But the reaction between Si- and H-results in a severe loss of silicon nitride offset spacer; in some cases, the silicon nitride offset spacer is even removed, as shown in the circle on diagram "b" of FIG. 1.

FIG. 2 shows the impact of $O_2$ to the $H_2/N_2$ gas mixture ratio on the offset spacer critical dimension of PMOS and NMOS devices. As shown in FIG. 2, the higher the ratio of $O_2$ to the $H_2/N_2$ gas mixture is, the smaller a reduction on the critical dimension of the offset spacer of PMOS and NMOS becomes.

BRIEF SUMMARY OF THE INVENTION

Embodiments of the present invention provide a method of manufacturing a semiconductor device capable of reducing the loss of Si and silicon nitride during an ashing process.

According to one embodiment of the present invention, a method of manufacturing a semiconductor device comprises placing a semiconductor substrate in an ashing chamber, the semiconductor substrate has a gate, a silicon nitride gate sidewall offset spacer or a silicon nitride gate sidewall spacer formed thereon, and a photo resist residue remaining thereon. The method also includes introducing a gas mixture including a deuterium ($D_2$) gas or a tritium ($T_2$) gas into the ashing chamber, and ashing the photo resist residue using a plasma that is formed from the gas mixture.

In an embodiment, the gas mixture comprises a nitrogen gas.

In an embodiment, a ratio of the $D_2$ in the gas mixture is about 1% to about 20% by volume. In another embodiment, a ratio of the $T_2$ in the gas mixture is about 1% to about 20% by volume.

In an embodiment, the gas mixture further comprises an inert gas or $O_2$. In a specific embodiment, a ratio of the $O_2$ in the gas mixture is about 1% to about 50% by volume.

In an embodiment, the ashing chamber comprises a temperature in the range from about 150° C. to about 300° C., a pressure in the range from about 300 mTorr to about 2 Torr, a flow rate of the $D_2$ or $T_2$ gas in the range from 500 sccm to 10000 sccm.

In an embodiment, the gate, and the silicon nitride gate sidewall offset spacer are formed on the semiconductor substrate prior to placing the semiconductor substrate in the ashing chamber, the method further comprises forming the gate on the semiconductor substrate; depositing a silicon nitride layer overlying the semiconductor substrate including the gate; etching the silicon nitride layer to form the silicon nitride gate sidewall offset spacer; coating a photo resist layer on the semiconductor substrate; patterning the photo resist layer; and performing a lightly doped drain implantation using the patterned photo resist layer as a mask.

In an embodiment, the lightly doped drain implantation is a high dose implantation.

In an alternative embodiment, the gate, and the silicon nitride gate sidewall spacer are formed on the semiconductor substrate prior to placing a semiconductor substrate in the ashing chamber, the method further comprises forming the gate on the semiconductor substrate; performing a lightly doped drain implantation on both sides of the gate; depositing a silicon nitride layer overlying the semiconductor substrate including the gate; and etching the silicon nitride layer to form a silicon nitride gate sidewall spacer. The method further includes coating a photo resist layer overlying the semiconductor substrate including the gate and the silicon nitride gate sidewall spacer; patterning the photo resist layer; and performing a source or a drain implantation on the semiconductor substrate using the patterned photo resist layer as a mask.

In the method of manufacturing a semiconductor device according to one embodiment of this disclosure, a photo resist is ashed using a gas mixture comprising a $D_2$ or $T_2$ gas. The method reduces or eliminates the generation of Si recess and the loss of silicon nitride thin film, thereby improving the performance of the semiconductor device.

BRIEF DESCRIPTION OF THE DRAWINGS

Other benefits, advantages, and novel features of the invention will become more apparent from the following detailed description when taken in conjunction with the accompanying drawings.

DETAILED DESCRIPTION OF THE INVENTION

The present invention will be described more thoroughly with reference to accompanying drawings in which exemplary embodiments of the present invention are illustrated.

In general, the ashing rate in a deuterium ($D_2$) plasma is slower than that in a $H_2$ discharge plasma. For example, in the $H_2$ discharge plasma, the ashing rate of a 193 nm photo resist at 250° C. is 245 nm/min, however, in the $D_2$ plasma, the ashing rate of the 193 nm photo resist at 250° C. is 160 nm/min (see Guido J. Stueber and Gottlieb S. Oehrleina J. Vac. Sci. Technol. B 25, 5, p 1593 September/October 2007). The difference in the ashing rate can be explained by the dynamic isotope effect when forming a C—H or a C-D bond. Elements with higher rate are usually used by one skilled in the art, and the lower ashing rate of $D_2$ does not motivate one skilled in the art to use $D_2$ in the ashing process.

A Si-D bond is stronger than a Si—H bond (see Kangguo Cheng, et al. JOURNAL OF APPLIED PHYSICS VOLUME 90, NUMBER 12 15 DECEMBER 2001), which is noticed by the inventor during research. Formula (I) is shown as follows:

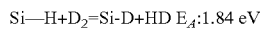

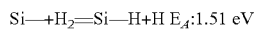
(1)

From equation (1), it can be seen that it needs more energy to form a Si-D bond than a Si—H bond, so when $D_2$ is used instead of $H_2$ in the ashing process, not only a smaller loss of Si can be achieved, but also a loss of silicon nitride spacer during ashing can also be reduced. Tritium ($T_2$) can achieve a similar effect as $D_2$.

Figure 1:
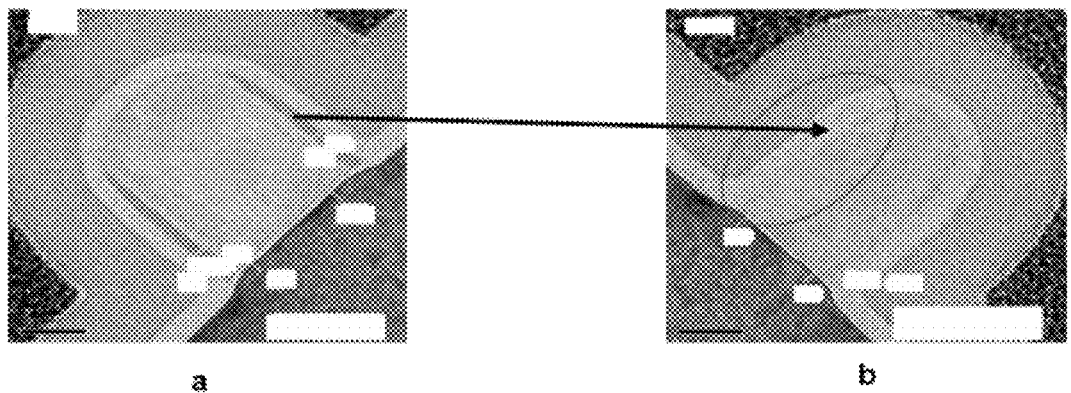
FIG. 1 shows diagrams illustrating the effect of an ashing process using $O_2$ and the effect of an ashing process using $H_2/N_2$ gas mixture on the loss of silicon nitride offset spacer, as known in the prior art.
Figure 2:
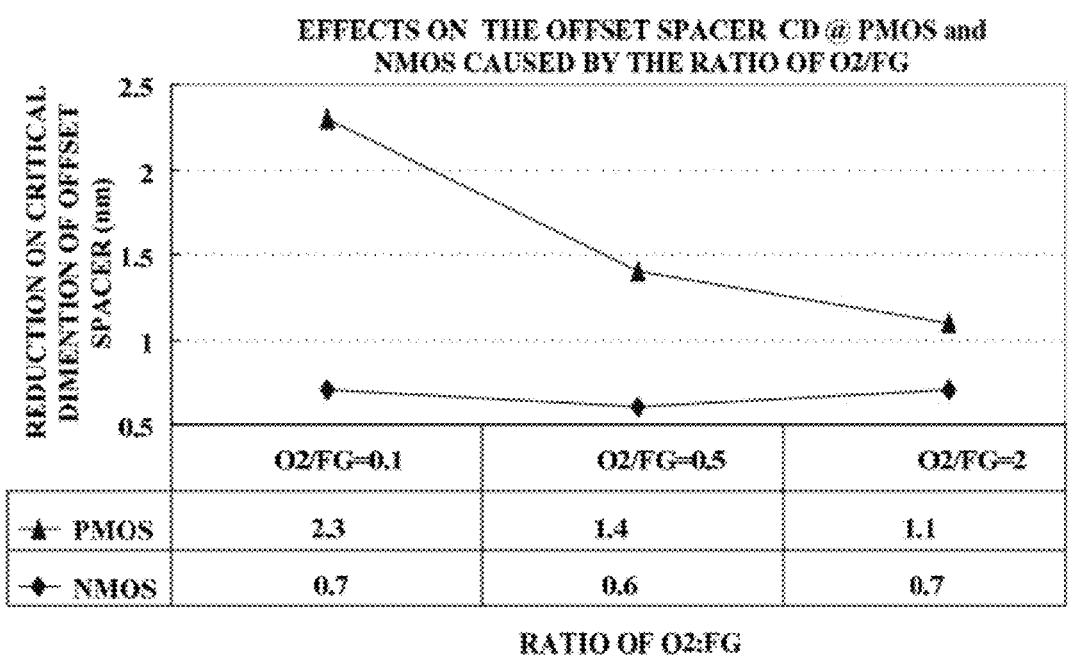
FIG. 2 shows the impact of $O_2$ to the $H_2/N_2$ gas mixture ratio on an offset spacer critical dimension (CD) of PMOS and NMOS devices.
Figure 3:
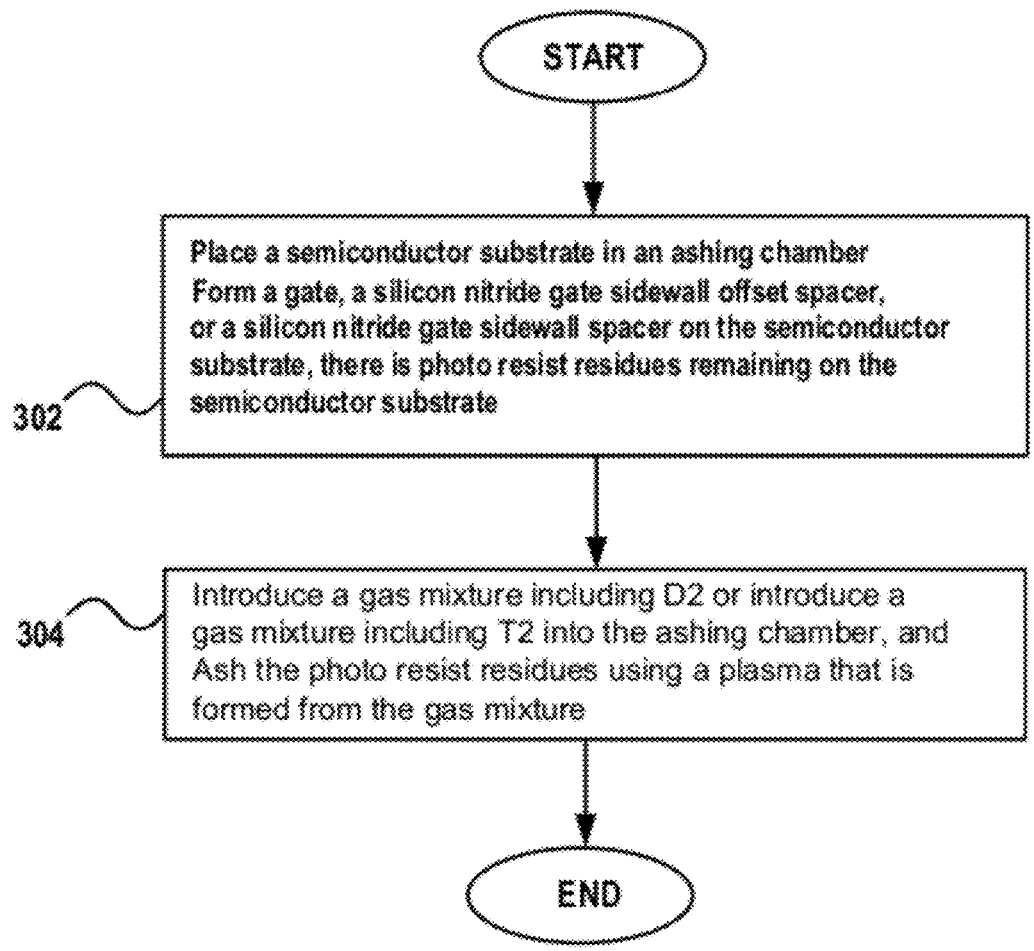
FIG. 3 shows a flowchart diagram illustrating a method of manufacturing a semiconductor device according to a first embodiment of the present invention.

FIG. 3 shows a flowchart diagram of a method of manufacturing a semiconductor device according to a first embodiment of the present invention. As shown in FIG. 3, a semiconductor substrate is placed in an ashing chamber (step 302). A gate, a silicon nitride gate sidewall offset spacer or a silicon nitride gate sidewall spacer can be formed on the semiconductor substrate. There are photo resist residues remaining on the semiconductor substrate. The photo resist residues can be the residuals after an etching or an implantation process.

At step 304, a gas mixture including $D_2$ or a gas mixture including $T_2$ can be introduced into the ashing chamber, and the photo resist residues can be ashed using a plasma that is formed from the gas mixture. In an embodiment, the gas mixture including $D_2$ can include $D_2$ and $N_2$. In another embodiment, the gas mixture including $D_2$ can include $D_2$ and an inert gas (e.g., He, Ar). Similarly, the gas mixture including $T_2$ can include $T_2$ and $N_2$, or the as mixture including $T_2$ can include $T_2$ and an inert gas (e.g., He, Ar), and the like.

In some embodiments, through ashing the photo resist using the gas mixture including $D_2$ or $T_2$, Si recesses and the loss of silicon nitride thin film can be reduced, and the performance of the semiconductor device can be improved.

The gas mixture including $D_2$ or $T_2$ can form a plasma after processed by a plasma source (or a plasma generator). The Deuterium-group or Tritium-group generated in the ashing chamber diffuses on the surface of the semiconductor substrate, $D_2$ or $T_2$ is absorbed by the photo resist, and reacts with the photo resist. The reaction products can be desorbed, and diffused into a bulk gas, and then be emitted from the ashing chamber.

In one embodiment of the present invention, a ratio of $D_2$ or $T_2$ in the gas mixture can be about 1% to about 20% by volume. In another embodiment of the present invention, the gas mixture can also include $O_2$ besides $D_2$ or $T_2$, $N_2$ or an inert gas. For example, the gas mixture includes $D_2$, $N_2$ and $O_2$, or the gas mixture includes $D_2$, an inert gas and $O_2$, or the gas mixture includes $T_2$, $N_2$ and $O_2$, or the gas mixture includes $T_2$, an inert gas and $O_2$. The ratio of $O_2$ in the gas mixture can be about 1% to about 50% by volume. In an embodiment, the ashing rate can be adjusted by changing the ratio of $O_2$ in the gas mixture. The gas mixture can also include other gases, for example, fluoride. In one embodiment, the ashing process comprises a temperature in the range from about 150° C. to about 300° C., a pressure in the range from about 300 mTorr to about 2 Torr, a flow rate of the $D_2$ or $T_2$ in the range from 500 sccm to 10000 sccm (standard cubic centimeter per minute). Next the impact of various conditions to the ashing effect will be described through experimental data.

Figure 4:
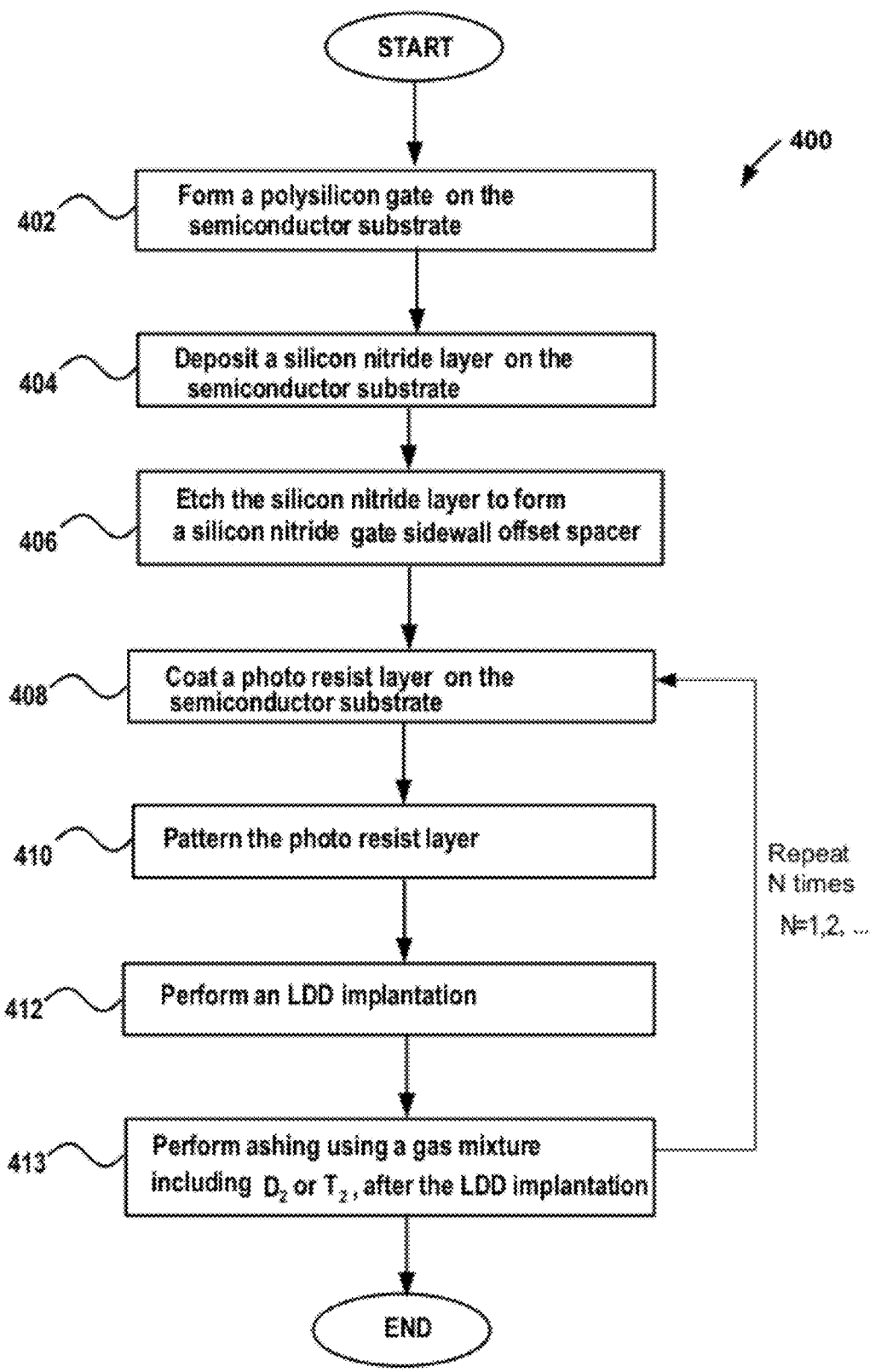
FIG. 4 shows a flowchart diagram illustrating a method of manufacturing a semiconductor device according to a second embodiment of the present invention.

FIG. 4 shows a flowchart diagram illustrating a method 400 of manufacturing a semiconductor device according to a second embodiment of the present invention.

As shown in FIG. 4, a polysilicon gate can be formed on a semiconductor substrate (step 402). At step 404, a silicon nitride layer can be deposited on the semiconductor substrate and on the polysilicon gate.

At step 406, the silicon nitride layer can be etched to form a silicon nitride gate sidewall offset spacer on each side of the polysilicon gate.

At step 408, a photo resist layer can be coated on the semiconductor substrate including the polysilicon gate and the silicon nitride gate sidewall offset spacer.

At step 410, the photo resist layer is patterned to form a lightly doped drain region.

At step 412, an LDD implantation can be performed using the patterned photo resist layer. The LDD implantation can be a high dose implantation, or medium, low dose implantation.

At step 413, ashing can be performed using the gas mixture including $D_2$ or $T_2$, after the LDD implantation. The gas mixture can, for example, include $D_2$ and $N_2$, or the gas mixture can include $D_2$ and helium (He).

According to applications, as shown in FIG. 4, steps 408-413 can be performed more than once. For example, according to requirement of devices, the number of the repeated LDD implantations, as well as the elements of implantation, can be determined in order to modify device parameters, such as Vt (threshold voltage), Rs (thin film resistance), and Jleakage (drain current).

In the above described embodiment, through ashing the photo resist on the semiconductor substrate after LDD implantation using the gas mixture including $D_2$ or $T_2$, the loss of Si and silicon nitride offset spacer can be reduced. In a specific embodiment, for the process which needs several repeats of LDD implantations, the method can achieve better effects of removing the photo resist after LDD implantation. Better effects can also even be achieved for removing the photo resist after a high dose implantation. In a specific embodiment, the ion implantation is carried out at a dose in the range from about 1E14 per cm$^2$ to about 9E15 per cm$^2$.

Figure 5:
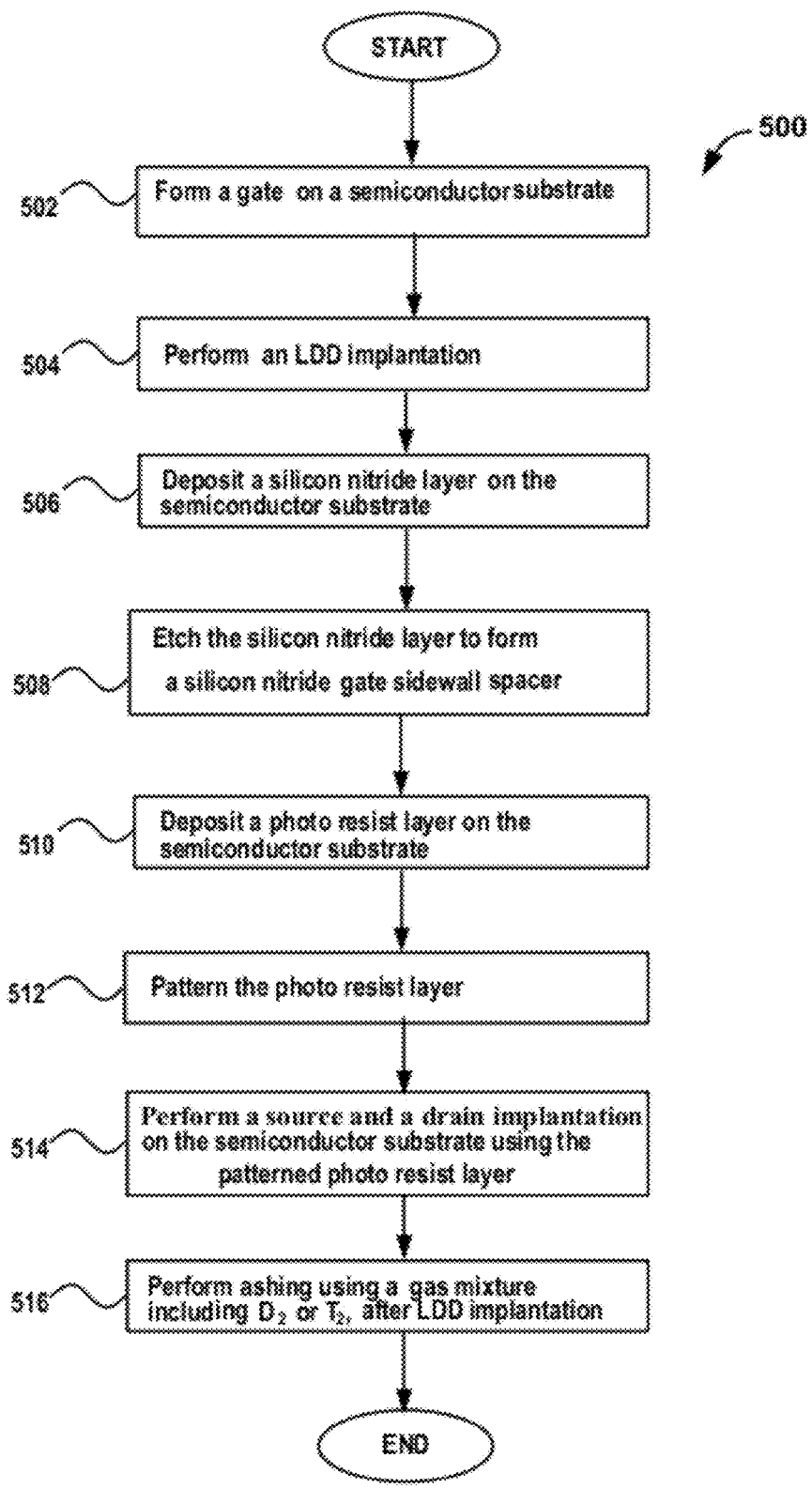
FIG. 5 shows a flowchart diagram illustrating a method of manufacturing a semiconductor device according to a third embodiment of the present invention.

FIG. 5 shows a flowchart diagram illustrating a method 500 of manufacturing a semiconductor device according to a third embodiment of the present invention.

As shown in FIG. 5, a gate can be formed on a semiconductor substrate, the gate has sidewalls that are substantially vertical (step 502).

At step 504, an LDD implantation can be performed in the semiconductor substrate to form LDD regions at both sides of the gate using the gate as a mask.

At step 506, a silicon nitride layer can be deposited on the semiconductor substrate including the gate.

At step 508, the silicon nitride layer can be etched to form a silicon nitride gate sidewall spacer on each sidewall of the gate.

At step 510, a photo resist layer can be coated on the semiconductor substrate including the gate and the silicon nitride gate sidewall spacers.

At step 512, the photo resist layer can be patterned.

At step 514, a source and a drain implantation can be performed in the semiconductor substrate using the patterned photo resist layer as a mask.

At step 516, ashing can be performed using the gas mixture including $D_2$ or $T_2$, after LDD implantation. The semiconductor substrate can be placed in the ashing chamber, wherein the gate and silicon nitride gate sidewall spacers are formed on the semiconductor substrate, and photo resist residues remain on the semiconductor substrate after the source and drain implantation. The gas mixture including $D_2$ or $T_2$ can be introduced into the ashing chamber, and the photo resist residues can be ashed through the plasma formed from the gas mixture.

It should be noticed that in the above embodiment, step 504 can include a step of forming a photo resist layer, a step of forming a photo resist pattern, a step of performing an LDD implantation, a step of stripping the photo resist (ashing step). The ashing step can use the gas mixture which includes $D_2$ or $T_2$ for ashing. According to applications, step 504 can be repeated several times.

In the above described embodiment, through ashing the photo resist residues on the semiconductor substrate after source/drain implantation using the gas mixture including $D_2$ or $T_2$, the generation of Si recess and the loss of silicon nitride spacers can be reduced to meet requirements of current processes. The above described embodiment also provides better effects for removing the photo resist residues even after a high dose implantation.

Figure 6:
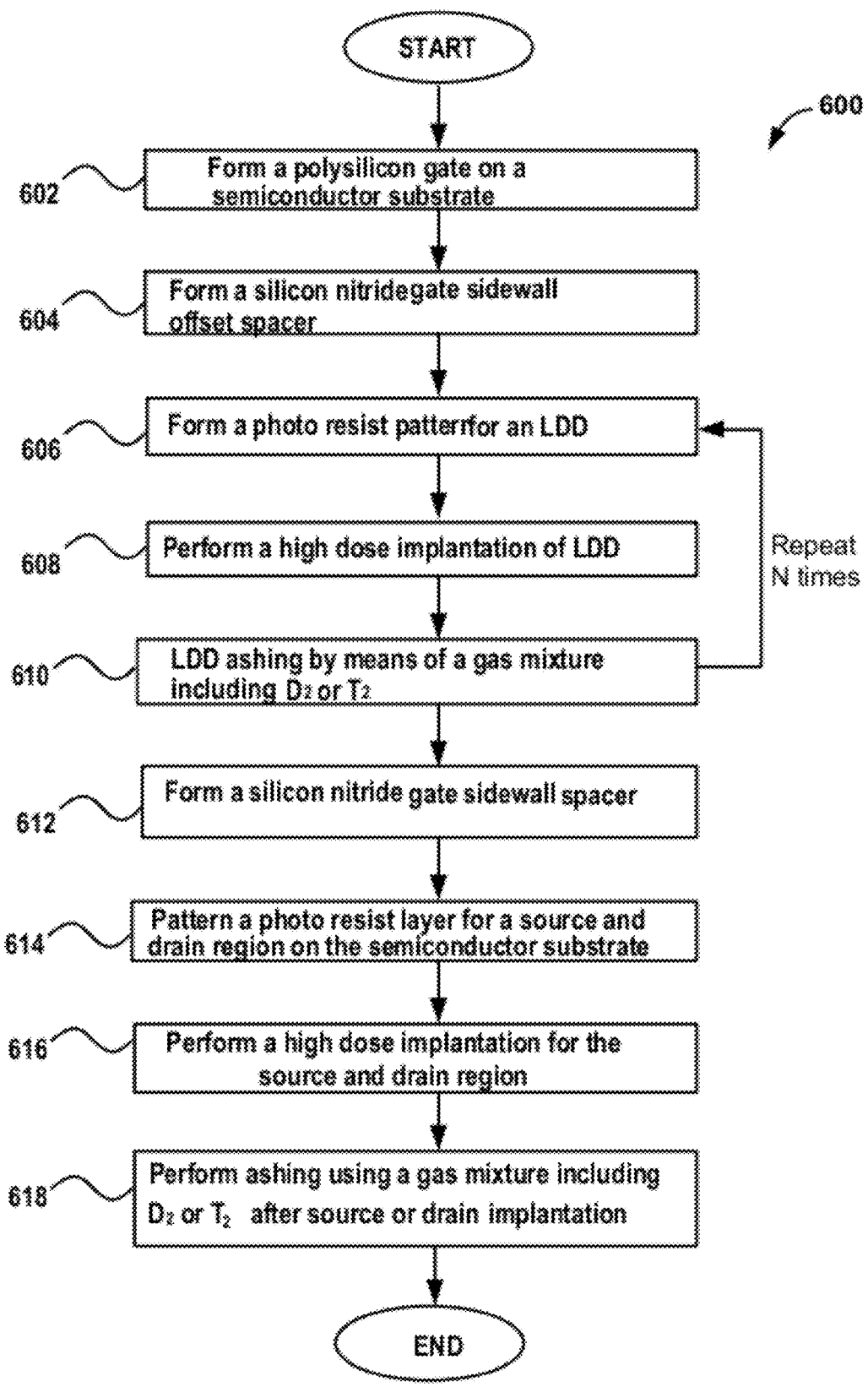
FIG. 6 shows a flowchart diagram illustrating a method of manufacturing a semiconductor device according to a fourth embodiment of the present invention.

FIG. 6 shows a flowchart diagram illustrating a method 600 of manufacturing a semiconductor device according to a fourth embodiment of the present invention.

As shown in FIG. 6, a polysilicon gate can be formed on a semiconductor substrate, the polysilicon gate includes a sidewall on each side of the gate (step 602).

At step 604, a silicon nitride gate sidewall offset spacer can be formed along the sidewalls of the gate.

At step 606, a photo resist pattern for defining LDD regions in the semiconductor substrate can be formed.

At step 608, a high dose implantation of LDD can be performed in the defined LDD regions, the high dose implantation may be carried out at a dose in the range from about 1E14 per cm$^2$ to about 9E15 per cm$^2$.

At step 610, an LDD ashing can be done by means of a gas mixture including $D_2$ or $T_2$.

At step 612, a silicon nitride gate sidewall spacer can be formed on the silicon nitride gate sidewall offset spacers.

At step 614, a photo resist layer for the source and drain regions on the semiconductor substrate can be patterned.

At step 616, a high dose implantation for the source and drain in the semiconductor substrate can be performed using the patterned photo resist layer as a mask.

At step 618, ashing can be performed using the gas mixture including $D_2$ or $T_2$ after source or drain implantation.

It should be noticed that steps 606 through 610 can be repeated several times depending on applications.

In the above embodiment, through respectively ashing the photo resist residues on the semiconductor substrate after a high dose LDD implantation and the photo resist residues after the source or drain implantation using the gas mixture which includes $D_2$ or $T_2$, the Si recess and the loss of silicon nitride offset spacer and silicon nitride spacer can be reduced to meet the requirements of current processes. Better effects can also be achieved for removing the photo resist residues after a high dose implantation.

Figure 7:
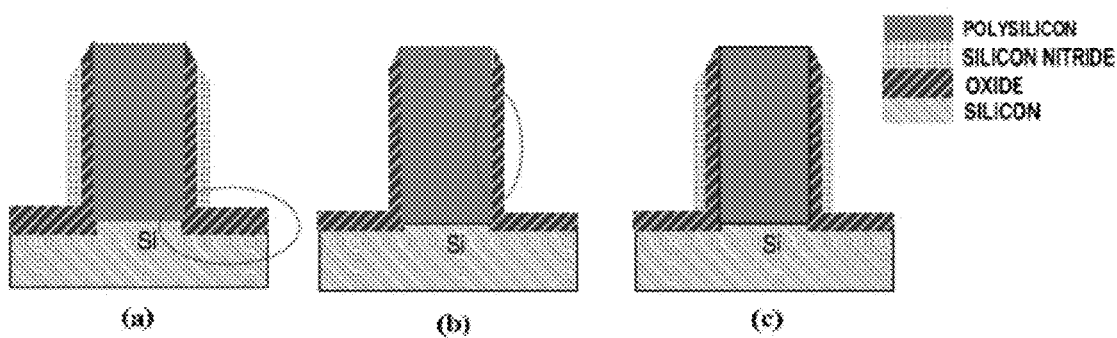
FIG. 7 schematically shows a comparison between the effect of an ashing process according to the present invention and the effect of a conventional ashing process.

FIG. 7 schematically shows the effect of the ashing process according to embodiments of the present invention and the effect of a conventional ashing process. In FIG. 7, the diagram labeled (a) illustrates a cross-sectional view of a semiconductor device according to a conventional $O_2$ rich ashing method, the diagram labeled (b) illustrates a cross-sectional view of a semiconductor device according to a conventional ashing method by means of a gas mixture including $H_2/N_2$; and the diagram labeled (c) illustrates a cross-sectional view of a semiconductor device according to an ashing method by means of a gas mixture including $D_2/T_2$ according to an embodiment of the present invention. As shown in FIG. 7, the $O_2$ rich ashing method results in a severe loss of Si (circled in diagram (a)). In the $H_2/N_2$ gas mixture rich ashing method, the loss of Si is reduced, however, the loss of silicon nitride (circled in diagram (b)) is more severe. In the ashing method by means of a gas mixture including $D_2/T_2$, the loss of Si is less than that in diagrams (a) and (b), and the loss of silicon nitride is less than that in diagram (b).

While the foregoing description and drawings represent the embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention not limited to the foregoing description.

What is claimed is:

1. A method of manufacturing a semiconductor device, the method comprising:
    placing a semiconductor substrate in an ashing chamber, the semiconductor substrate having a gate, a silicon nitride gate sidewall offset spacer formed thereon, and a photo resist residue remaining thereon;
    introducing a gas mixture including a tritium gas into said ashing chamber, and
    ashing the photo resist residue using a plasma that is formed from said gas mixture;
    wherein a ratio of the tritium gas in said mixture is about 1% to about 20% by volume.

2. The method of claim 1 wherein said gas mixture comprises a nitrogen gas.

3. The method of claim 1, wherein said gas mixture further comprises an inert gas.

4. The method of claim 1, wherein said gas mixture further comprises an oxygen gas.

5. The method of claim 4, wherein a ratio of the oxygen gas in said gas mixture is about 1% to about 50% by volume.

6. The method of claim 1, wherein the ashing comprises ashing at a temperature in the range from about 150° C. to about 300° C., a pressure in the range from about 300 mTorr to about 2 Torr, a flow rate of tritium gas in the range from 500 sccm to 10000 sccm.

7. The method of claim 1 further comprising, prior to placing said semiconductor substrate in said ashing chamber:
    forming said gate on said semiconductor substrate;
    depositing a silicon nitride layer on said semiconductor substrate;
    etching said silicon nitride layer to form said silicon nitride gate sidewall offset spacer
    coating a photo resist layer on said semiconductor substrate;
    patterning the photo resist layer to form a lightly doped drain region;
    performing a lightly doped drain implantation using the patterned photo resist layer.

8. The method of claim 7, wherein said lightly doped drain implantation is a high dose implantation.

9. The method of claim 1 further comprising, prior to placing the semiconductor substrate in the ashing chamber:
    forming said gate on said semiconductor substrate;
    performing a lightly doped drain implantation;
    depositing a silicon nitride layer on said semiconductor substrate;
    etching said silicon nitride layer to form a silicon nitride gate sidewall spacer;
    coating a photo resist layer on said semiconductor substrate;
    patterning the photo resist layer;
    performing a source or a drain implantation on said semiconductor substrate using the patterned photo resist layer.

* * * * *